United States Patent [19]

Bajor

[11] Patent Number: 5,028,973

[45] Date of Patent: Jul. 2, 1991

[54] BIPOLAR TRANSISTOR WITH HIGH EFFICIENT EMITTER

[75] Inventor: George S. Bajor, Melbourne, Fla.

[73] Assignee: Harris Corporation, Melbourne, Fla.

[21] Appl. No.: 367,788

[22] Filed: Jun. 19, 1989

[51] Int. Cl.$^5$ .................... H01L 29/72; H01L 23/48; H01L 29/40

[52] U.S. Cl. ........................... 357/34; 357/65; 357/2

[58] Field of Search .............. 357/34, 35, 65, 4, 2; 437/164, 165

[56] References Cited

U.S. PATENT DOCUMENTS

| | | | |
|---|---|---|---|
| 4,062,034 | 12/1977 | Matsushita et al. | 357/16 |
| 4,063,967 | 12/1977 | Graul et al. | 148/1.5 |
| 4,151,006 | 4/1979 | De Graaff et al. | 148/1.5 |
| 4,302,763 | 11/1981 | Ohuchi et al. | 357/63 |
| 4,431,460 | 2/1984 | Barson et al. | 357/91 |
| 4,467,519 | 8/1984 | Glang et al. | 29/576 |
| 4,583,106 | 4/1986 | Anantha et al. | 357/35 |
| 4,672,413 | 6/1987 | Gardner | 357/6 |
| 4,849,364 | 7/1989 | Scovell et al. | 437/31 |
| 4,853,342 | 8/1989 | Taka et al. | 437/31 |
| 4,949,145 | 8/1990 | Yano et al. | 357/34 |

FOREIGN PATENT DOCUMENTS

| | | | |
|---|---|---|---|
| 61-99374 | 5/1986 | Japan | 357/34 |
| 63-261749 | 11/1988 | Japan | 357/34 |

OTHER PUBLICATIONS

K. Sasaki, M. M. Rahman & S. Furukawa—An Amorphous SiC:H Emitter Heterojunction Bipolar Transistor, 6/6/85, pp. 311-312.
K. Sasaki, M. M. Rahman & S Furukawa—An Amorphous SiC:H Emitter/Crystalline, Si Heterobipolar Transistor.
K. Sasaki, Seijiro Furukawa & M. M. Rahman—A Novel Structure Amorphous SiC:N Emitter HBT Using Low Temperature Process, 1985—pp. 295-297.
J. Symons, M. Ghannam, A. Neugroschel, J. Nus & R. Mertens—Silicon Heterojunction Bipolar Transistors with Amorphous and Microcrystalline Emitters—1987, pp. 1143-1145.
Ning et al., "An Advanced High Performance Trench-Isolated Self-Aligned Bipolar Tech." IEEE Trans. ED-34, 11/87, pp. 2246-2252.
Tsachimoto et al., "Double Implanted UHF Power Transistor with Epitaxial Overcoat Contact to Shallow Emitter" Solid-State Electronics, 1976, vol. 19, p. 1043-1045.
IBM Technical Disclosure Bulletin, vol. 28, No. 10, Mar. 86, "Selective Epitaxial/Quasi-Epi Emitters".

Primary Examiner—Jerome Jackson, Jr.
Assistant Examiner—Donald L. Monin
Attorney, Agent, or Firm—Barnes & Thornburg

[57] ABSTRACT

A bipolar transistor structure having single crystal emitter, base and collector regions a first emitter contact layer of a higher bandgap than the single crystal and polycrystalline forms of the semiconductor material which forms the emitter and of the same conductivity type as the emitter, and a second emitter contact layer of a substantially polycrystalline form of the semiconductor material and of the same conductivity type as the emitter, on the first emitter contact layer. The higher bandgap first emitter contact layer serves as a barrier for the minority carriers, thus enhancing the emitter efficiency.

11 Claims, 2 Drawing Sheets

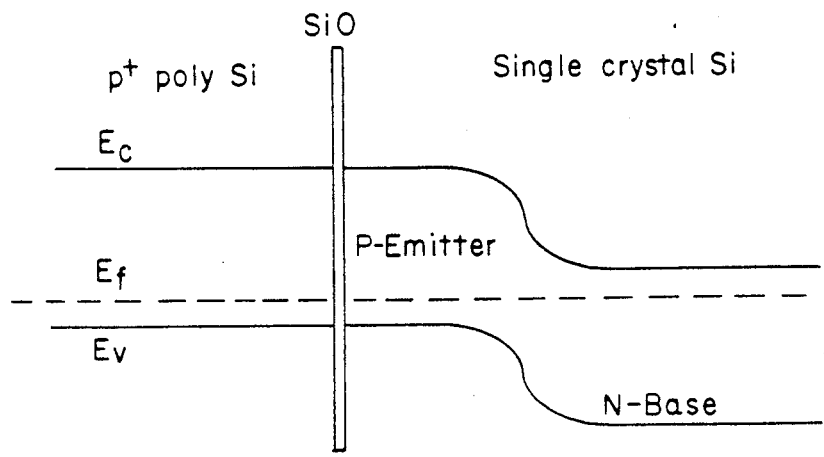
PRIOR ART
FIG. 1
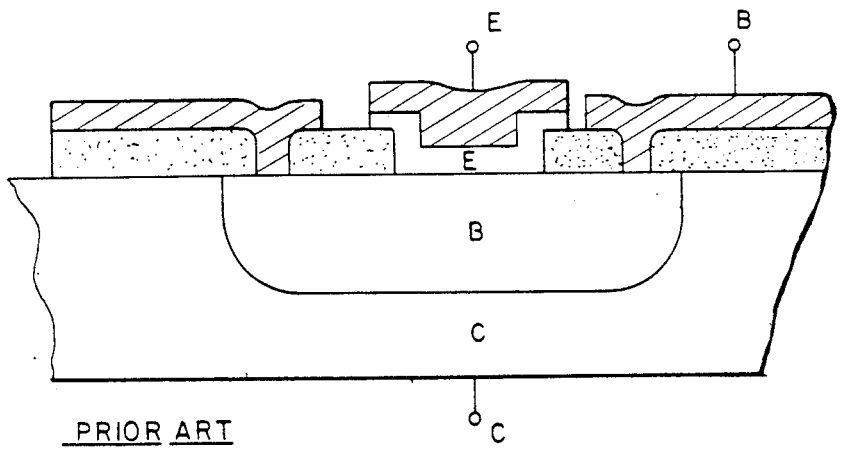
PRIOR ART
FIG. 2
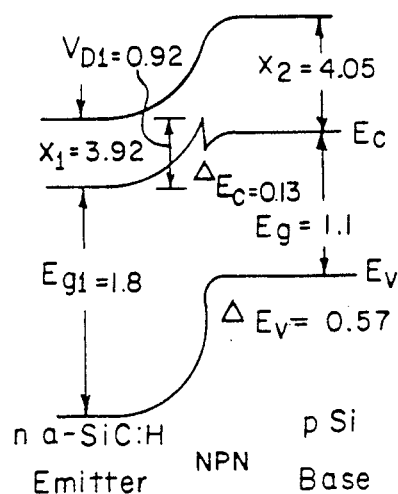 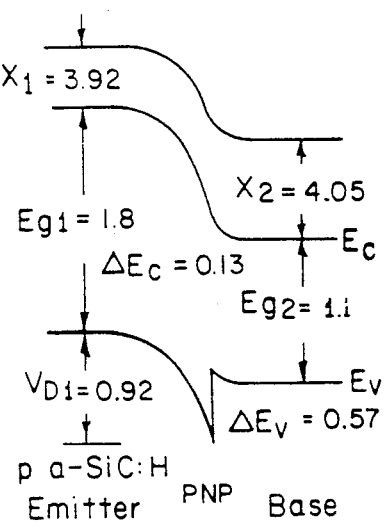
PRIOR ART
FIG. 3a
PRIOR ART
FIG. 3b

BIPOLAR TRANSISTOR WITH HIGH EFFICIENT EMITTER

BACKGROUND AND SUMMARY OF THE INVENTION

The present invention relates generally to bipolar transistors, more specifically to high emitter efficient bipolar transistors for operation at ultra high frequencies.

One of the most important parameters of the bipolar transistors is the emitter efficiency. This parameter has to be as close to one as possible to get large current gain. The larger the minority carrier current in the emitter, the smaller is the emitter efficiency, i.e. the increase of the minority carrier current will cause a decrease of the current gain.

Besides the emitter-base bias voltage, the minority carrier current in the emitter depends on the ratio of the doping concentrations of the emitter and the base, and the diffusion length of the minority carriers in the emitter. In transistors with shallow emitter, the emitter width controls the minority carrier current rather than the diffusion length. Since in very high frequency transistors both the ratio of the doping concentrations in the emitter and the base, and the thin emitter influence the emitter efficiency unfavorably, new methods were used for the reduction of the minority current in the emitter. In principle the new methods can be classified into three categories namely (a) extended emitters, (b) tunneling through thin emitter oxide and (c) heterojunction emitters.

For an extended emitter, a polycrystalline silicon layer is grown on the shallow emitter to extend its length. The extension of the 500-600 Angstrom thick emitter with a 2-4 K Angstrom thick poly silicon layer works fine on NPN transistors where the minority carriers in the emitter are holes with short diffusion length. However, experimental results and speculations indicated that for PNP transistors the emitter should be extended well above 1 micron to increase the emitter efficiency. This would make the manufacturability of the PNP transistors inefficient.

For tunneling, a thin oxide layer is provided at the poly-single crystal interface. As shown in the energy band structure in FIG. 1, the oxide creates an energy barrier for both type of carriers. This energy barrier will decrease the minority carrier current, but will also cause an increase in the resistance of the emitter. In practice this is a transistor with a large emitter efficiency, but it can't be used for high frequency application because of the parasitic emitter resistance.

A heterojunction emitter is illustrated in FIG. 2 having an amorphous emitter on a single crystal base. If the emitter material has wider a bandgap than the base, the potential barrier at the heterojunction interface will decrease the minority carrier current. One of the most recent research in this field is directed towards the amorphous SiC as the emitter material of a silicon transistor. The bandgap of the a-SiC is 1.8 eV, that is significantly larger than that of the silicon, which is only 1.1 eV. Unfortunately, it was found that this heterojunction emitter works only for NPN transistors, as illustrated by the energy band of FIG. 3A. From the energy band diagram in FIG. 3B, the energy barrier for electrons in the P-emitter is only 0.13 eV larger than the energy barrier of a silicon PN homojunction. Therefore, the effect of the heterojunction structure for PNP transistors is minimal.

A number of publications describing heterojunction transistor structure with amorphous SiC:H, or other emitter material, and signal crystal Si base and collector, both NPN and PNP structure. These publications—Sasaki, et al.: 1985 Device Research Conference SVIB-2; Sasaki, et al.: IEEE Electron Device Letters, Vol. 6, No. 6, June 1985, p. 311; Sasaki, et al.: IEDM 85, p. 294; Symons, et al.: Solid State Electronics, Vol. 30, p. 1143, 1987 just to name a few of them, describe only the benefit of the heterojunction structure with respect to the emitter efficiency. Sasaki (IEDM 85, pp. 294) also analyzed the relatively low current gain of the PNP transistor with a-SiC:H emitter. He speculated that "From the energy band profile it can be seen that the barrier energy for electrons, $\Delta E_C$ is rather low in the PNP structure suggesting considerably large back-injection of electrons into the emitter resulting in low current gain."

Since the mobility of the electrons and holes in amorphous SiC is expected to be significantly smaller than in single crystal or even in polycrystalline silicon, and because the activation energy of the dopants in a wide bandgap material is larger than in lower bandgap material, a transistor with amorphous SiC emitter will have significantly larger emitter resistance than the same transistor with polycrystalline silicon emitter. For this reason, it can be expected that in UHF technology a-SiC:H or any other amorphous wide bandgap emitter will not be used.

There is another problem in manufacturing a-SiC:H. A special type of MOCVD reactor is necessary to deposit a few thousand Angstrom thick emitter layer. Such a reactor is presently not part of the silicon base IC manufacturing, and its compatibility is not known.

Thus, it is an object of the invention to provide an high efficiency emitter capable of being operated at high frequencies.

Another object of the present invention is to provide a high efficiency emitter which has low emitter series resistance.

These and other objects of the invention are obtained by a bipolar transistor structure having single crystal emitter, base and collector regions, a first emitter contact layer of a higher bandgap than the single crystal and polycrystalline forms of the semiconductor material which forms the emitter and of the same conductivity type as the emitter, and a second emitter contact layer of a substantially polycrystalline form of the semiconductor material and of the same conductivity type as the emitter on the first emitter contact layer. The semiconductor material is silicon and the first emitter contact layer can be polycrystalline or amorphous having a thickness in the range of 50 to 200 Angstroms. The emitter region has a thickness in the range of approximately 400 to 800 Angstroms and the second of emitter contact layer has a thickness in the range of approximately 2000 to 4000 Angstroms. The emitter region and the second emitter contact layer have high impurity concentrations in the range of $10^{19}$ to $10^{21}$ carriers per cubic centimeter and the first emitter contact layer has an impurity concentration in the range of $10^{19}$ to $10^{21}$ carriers per cubic centimeter. The bipolar transistor may be NPN or PNP.

Other objects, advantages and novel features of the present invention will become apparent from the following detailed description of the invention when considered in conjunction with the accompanying drawings.

BRIEF DESCRIPTION OF THE DRAWINGS

FIG. 1 is an energy band diagram of a polycrystalline emitter structure with a thin oxide interface layer of the prior art.

FIG. 2 is a cross sectional view of a heterojunction emitter bipolar transistor of the prior art.

FIG. 3a and 3b are energy band diagrams for the heterojunction emitter for an NPN and a PNP of FIG. 2 respectively.

DETAILED DESCRIPTION OF THE DRAWINGS

Figure 4:
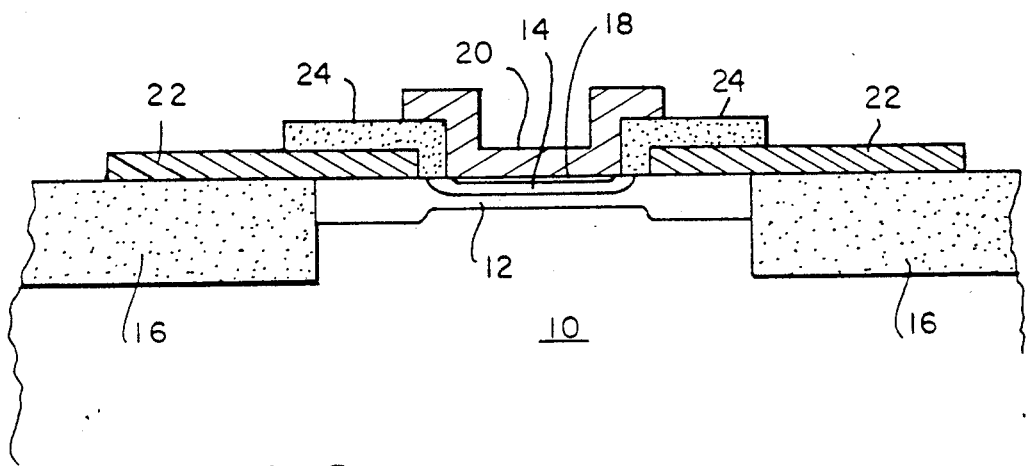
FIG. 4 is a cross sectional view of a bipolar transistor according to the principles of the present invention.

A bipolar transistor, as illustrated in FIG. 4, includes a collector region 10 of a first conductivity type, a base 12 of a second conductivity type and an emitter region 14 of the first conductivity type. Recessed oxide 16 is formed along the depth of the active regions. The concentration of the collectors is in the range of $10^{14}$ to $10^{16}$ carriers per cubic centimeter, the base region 12 has an impurity concentration in the range of $10^{15}$ to $10^{18}$ carriers per cubic centimeter and the emitter region 14 has an impurity Concentration in the range of $10^{19}$ to $10^{21}$ carriers per cub centimeter. The depth of the emitter is in the range of 500 to 1,000 Angstroms.

As previously discussed, in order for the shallow emitter to raise its efficiency, the length of the emitter must be increased. The increase of series resistance of the emitter with its increased width should be minimized. To achieve this objective, the width of the emitter is increased by using a doped polycrystalline silicon emitter contact layer 20, having a thickness in the range of 2000 to 4000 Angstroms and being doped to have the same conductivity type as the emitter and an impurity concentration in the range of $10^{19}$ to $10^{21}$ carriers per cubic centimeter. To provide a barrier to minority carriers and not a barrier to majority carriers while maintaining a low series resistance, a first emitter contact layer 18 is provided of a wide bandgap semiconductor material.

The emitter material 18 is a wider bandgap semiconductor material than in the polycrystalline second layer 20, and the single crystal semiconductor material which forms the emitter, base and collector regions. Using silicon for example, the wide bandgap semiconductor material may be an amorphous form of silicon as well as amorphous or polycrystalline silicon carbide. To provide a sufficient amount of material to act as a barrier without substantially increasing the serious resistance of the emitter, the thickness of the wide bandgap semiconductor film layer 18 should have a thickness in the range of 50 to 200 Angstroms.

The wide bandgaps semiconductor layer 18 also is doped with the same conductivity type of impurities as the emitter and the polycrystalline second layer 20. Because there is a relatively thin layer, doping may be achieved by implantation or deposition and diffusion after its formation, or by diffusion from the polycrystalline silicon second emitter contact layer 20.

Figure 5:
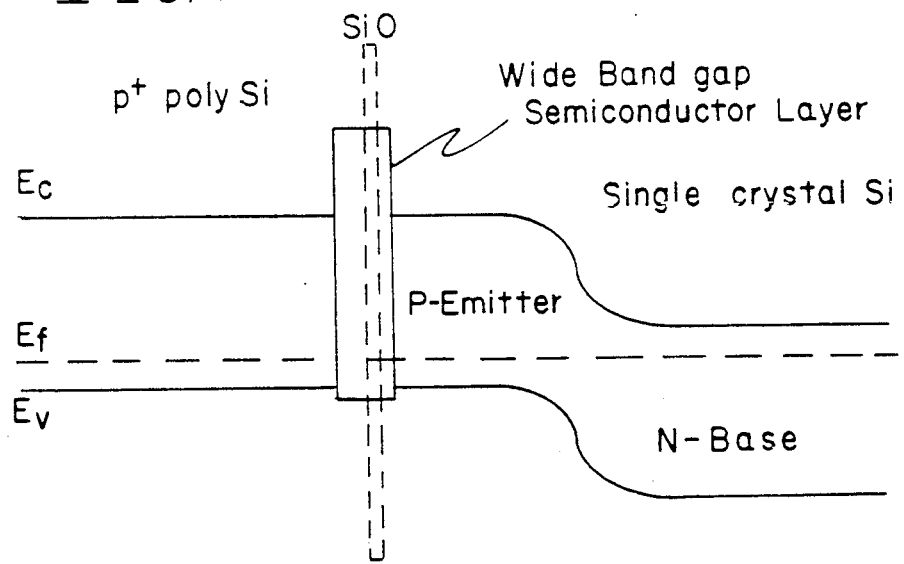
FIG. 5 is a energy band diagram of the device of FIG. 4 according to the principles of present invention.

As can be seen from the energy band diagram of FIG. 5, the thin wide bandgap semiconductor layer 18 will create a barrier for minority carriers both for the NPN and PNP transistor's polycrystalline-to-single crystal emitter portions. This structure is substantially different from the prior art heterojunction emitters where the emitter itself is a wide bandgap layer material on a single crystal base. It should also be noted that since the wide bandgap semiconductor layer 18 is relatively thin, MOCVD technology need not be used. Therefore the same technology used in the bipolar process, for example vacuum deposition technology including vacuum evaporation, sputtering, standard chemical vapor deposition, can be used.

Even though the polycrystalline second emitter contact layer 20 is heavily doped, this will not influence the height of the energy band discontinuity, but will increase its width. The majority carriers tunnel through the very thin width of the wide bandgap film layer 18.

The structure of FIG. 4 provides a potential barrier for the minority carriers in the emitter by using the wide bandgap semiconductor layer 18. This will reduce the minority carrier current in the emitter and thus increase the emitter efficiency. A properly built wide bandgap semiconductor layer 18 will not generate a potential barrier for the majority carriers and therefore will not increase the emitter resistance. This makes the structure FIG. 4 suitable for high frequency transistor technology. Because the wide bandgaps semiconductor layer 18 is thin, it can be deposited in different ways.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A bipolar transistor having high emitter efficiency and operable at ultra high frequencies comprising:
    a substrate of a single crystal form of silicon having a base region of a first conductivity type separating emitter and collector regions of a second conductivity type;
    a first emitter contact layer of an amorphous form of silicon having a higher bandgap than single crystal and substantially polycrystalline forms of silicon, and of said second conductivity type; and
    a second emitter contact layer on said first emitter contact layer of a substantially polycrystalline form of silicon and of said second conductivity type.

2. A bipolar transistor according to claim 1, wherein said first conductivity type is P and said second conductivity type is N to form an NPN bipolar transistor.

3. A bipolar transistor according to claim 1, wherein said emitter region has an impurity concentration of said second conductivity type greater than the impurity concentration of said first conductivity type of said base region.

4. A bipolar transistor according to claim 1, wherein said second emitter contact layer has a thickness in the range of approximately 2,000 to 4,000 Angstroms.

5. A bipolar transistor according to claim 1, wherein said emitter region has an impurity concentration in the range of $10^{19}$ to $10^{21}$ carriers per cubic centimeter; and said second emitter contact layer has an impurity concentration in the range of $10^{19}$ to $10^{21}$ carriers per cubic centimeter.

6. A bipolar transistor according to claim 5, wherein said first emitter contact layer has an impurity concentration in the range of $10^{19}$ to $10^{21}$ carriers per cubic centimeter.

7. A bipolar transistor according to claim 1, wherein said first conductivity type is N and said second conductivity type is P to form a PNP bipolar transistor.

8. A bipolar transistor having high emitter efficiency and operable at ultra high frequencies comprising:
   a substrate of a single crystal form of a first semiconductor material having a base region of a first conductivity type separating emitter and collector regions of a second conductivity type;
   a first emitter contact layer of a second semiconductor material having a higher bandgap than single crystal and substantially polycrystalline forms of said first semiconductor material, having a thickness in the range of approximately 50 to 200 Angstroms, and of said second conductivity type; and
   a second emitter contact layer on said first emitter contact layer of a substantially polycrystalline form of said first semiconductor material and of said second conductivity type.

9. A bipolar transistor according to claim 8, wherein said emitter region has a thickness in the range of approximately 400 to 800 Angstroms.

10. A bipolar transistor according to claim 9, wherein said second emitter contact layer has a thickness in the range of approximately 2,000 to 4,000 Angstroms.

11. A bipolar transistor according to claim 8, wherein said emitter region has an impurity concentration of said second conductivity type greater than the impurity concentration of said first conductivity type of said base region.

* * * * *